(12) United States Patent
Yu et al.

(10) Patent No.: US 8,274,420 B2
(45) Date of Patent: Sep. 25, 2012

(54) SUCCESSIVE APPROXIMATION ANALOG-TO-DIGITAL CONVERTER

(75) Inventors: Hyun Kyu Yu, Daejeon (KR); Seon Ho Han, Daejeon (KR); Young Hwa Kim, Seoul (KR); Seong Hwan Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 29 days.

(21) Appl. No.: 12/970,861

(22) Filed: Dec. 16, 2010

(65) Prior Publication Data

US 2011/0148684 A1 Jun. 23, 2011

(30) Foreign Application Priority Data

Dec. 18, 2009 (KR) .................. 10-2009-0127547
Apr. 19, 2010 (KR) .................. 10-2010-0035946

(51) Int. Cl.
  *H03M 1/38* (2006.01)
(52) U.S. Cl. ...................... 341/161; 341/155
(58) Field of Classification Search ............... 341/161, 341/155, 163, 127, 128, 150, 122, 133, 118, 341/135, 172, 141, 158, 165
  See application file for complete search history.

(56) References Cited

U.S. PATENT DOCUMENTS

| | | | |
|---|---|---|---|
| 5,206,650 A | 4/1993 | Parle et al. | |
| 7,265,706 B2 | 9/2007 | Boemler | |
| 2007/0210839 A1* | 9/2007 | Martines et al. | 327/112 |
| 2008/0012744 A1 | 1/2008 | Hurrell | |

FOREIGN PATENT DOCUMENTS

JP 5-110439 A 4/1993

OTHER PUBLICATIONS

Heemin Y. Yang et al., "A Time-Based Energy-Efficient Analog-to-Digital Converter", IEEE Journal of Solid-State Circuits, Aug. 2005, pp. 1590-1601, vol. 40, No. 8, IEEE.
Andrea Agnes et al., "A 9.4-ENOB 1V 3.8µW 100kS/s SAR ADC with Time-Domain Comparator", IEEE International Solid-State Circuits Conference, 2008, pp. 246-247, 610, Session 12, High-Efficiency Data Converters, 12.5, IEEE.
H.P. Le et al., "Ultra-low-power variable-resolution successive approximation ADC for biomedical application", Electronics Letters, 26$^{th}$ May 2005, vol. 41, No. 11.
Zhiheng Cao et al., "A 32mW 1.25GS.s 6b 2b/step SAR ADC in 0.13µm CMOS", IEEE International Solid-State Circuits Conference, 2008, pp. 542-543, 634, Session 30, Data-Converter Techniques, 30.2, IEEE.

* cited by examiner

*Primary Examiner* — Joseph Lauture (57) ABSTRACT

There is provided a successive approximation analog-to-digital converter including only minimal capacitors to perform an analog-to-digital conversion operation, thereby making it possible to have very strong process change resistance characteristics while having reduced capacitance and circuit area. The successive approximation analog-to-digital converter may include a reference current supplying unit that supplies a reference current; a signal storage unit that stores a reference signal generated by charging the reference current and an input signal input from the outside; a comparing unit that compares the reference signal and the input signal; and a controller that controls the reference current supplying unit while generating the digital output signal based on the comparison result of the comparing unit to change the supply amount of the reference current supplied to the signal storage unit in proportion to the binary code.

14 Claims, 6 Drawing Sheets

SUCCESSIVE APPROXIMATION ANALOG-TO-DIGITAL CONVERTER

CROSS-REFERENCE TO RELATED APPLICATIONS

This application claims the priorities of Korean Patent Application Nos. 10-2009-0127547 filed on Dec. 18, 2009 and 10-2010-0035946 filed on Apr. 19, 2010, in the Korean Intellectual Property Office, the disclosures of which are incorporated herein by reference.

BACKGROUND OF THE INVENTION

1. Field of the Invention

The present invention relates to a successive approximation analog-to-digital converter (hereinafter, referred to as an SAR ADC), and more particularly, to an SAR ADC having small capacitance and a small circuit area while having strong process change resistance characteristics.

2. Description of the Related Art

Most communication systems receive analog signals, digitally process the analog signals, convert the digitally processed signals into analog form, and output the signals converted into analog form.

Therefore, most communication systems essentially include an analog-to-digital signal converter and a digital-to-analog signal converter. The analog-to-digital signal converter is positioned at the first stage of the communication system to determine a signal to noise ratio (SNR) of an entire system. As a result, a designer is required to pay the most attention to the design of an analog block and to also pay attention to a power consumption block.

The SAR ADC is a type of analog-to-digital signal converter. The SAR ADC is mainly used as a relatively medium/slow speed data converter and has the characteristic of relatively small power consumption.

Figure 1:
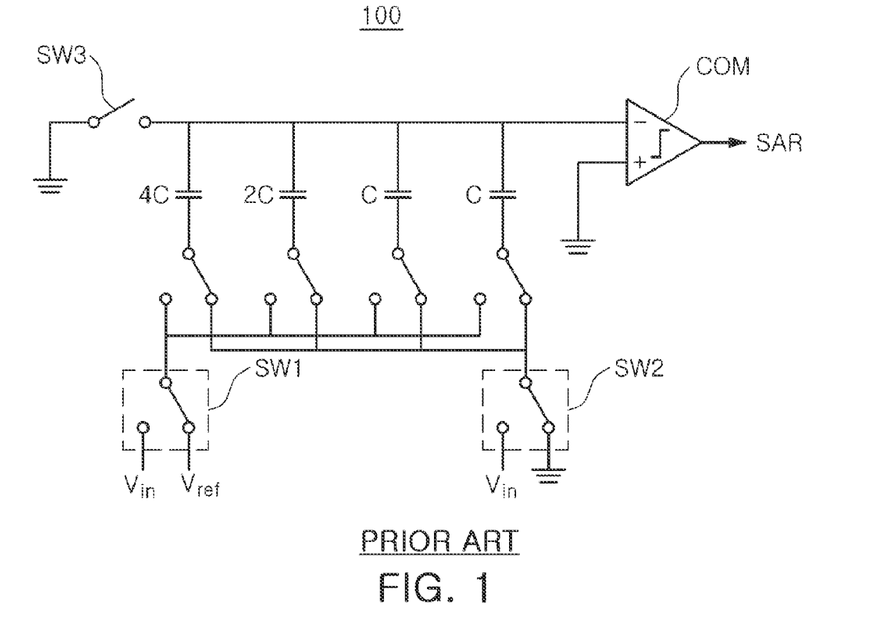
FIG. 1 is a diagram showing an SAR ADC according to the related art.

FIG. 1 is a diagram showing an SAR ADC according to the related art.

As shown in FIG. 1, the SAR ADC according to the related art includes a plurality of capacitors 4C, 2C, and C having binary scale capacitance and performs a binary search by the size ratio of the plurality of capacitors 4C, 2C, and C, thereby performing data conversion.

In the case of the SAR ADC of FIG. 1, the resolution of the SAR ADC is determined as the size ratio of each capacitor. When there is an error in the size ratio of the plurality of capacitors 4C, 2C, and C due to process change, the resolution of the entire SAR ADC is significantly deteriorated.

Since the capacitor occupying a relatively large area should be provided in plural, there is a problem in that the capacitance and the circuit area of the SAR ADC are also increased. For example, in order to obtain a resolution of 10 bits, a capacitance and a circuit area of up to 1024 times more than a unit capacitor are required. This causes a large RC time constant, which takes a very long time to stabilize the signal in each step. Therefore, it is difficult to perform high-speed sampling and conversion by using the SAR ADC according to the related art.

If the unit capacitor is minimized, the sampling and conversion speed can be improved; however, when the size of the unit capacitor is small, the incidence of process errors is greatly increased and thus, the SAR ADC should basically use a large capacitor.

SUMMARY OF THE INVENTION

An aspect of the present invention provides an SAR ADC including only minimum capacitors to perform an analog-to-digital conversion operation, thereby making it possible to have very strong process change resistance characteristics while having reduced capacitance and circuit area.

According to an aspect of the present invention, there is provided a successive approximation analog-to-digital converter, including: a reference current supplying unit that supplies a reference current; a signal storage unit that stores a reference signal generated by charging the reference current and an input signal input from the outside; a comparing unit that compares the reference signal and the input signal; and a controller that controls the reference current supplying unit while generating the digital output signal based on the comparison result of the comparing unit to change the supply amount of the reference current supplied to the signal storage unit in proportion to the binary code.

The controller may control the reference current supplying unit to change the supply time or the supply frequency of the reference current in proportion to the binary code.

The signal storage unit may include: a capacitor; and a first switch circuit that applies the input signal to the capacitor at the time of sampling the input signal and connects the reference current supplying unit to the capacitor at the time of sampling the reference current.

The reference current supplying unit may include: a first current source that supplies the reference current to the capacitor; a second current source that discharges the reference current from the capacitor; and a second switch circuit that connects the capacitor to the first current source or the second current source.

The controller may connect the capacitor to the first current source if the comparison result of the comparing unit is a first value and connect the capacitor to the second current source if the comparison result of the comparing unit is a second value.

The signal storage unit may include: first and second capacitors; and a first switch circuit that applies an input signal pair to the first and second capacitors at the time of sampling the input signal and allows the comparing unit to compare charges charged in the first and second capacitors while applying the current of the reference current supply unit to the second capacitor at the time of sampling the reference signal.

The reference current supply unit may include: first and second current sources that supply the reference current to each of the first and second capacitors; third and fourth current sources that discharge the reference current from each of the first and second capacitors; a second switch circuit that connects the first capacitor to the first current source and connects the second capacitor to the fourth current source or connects the first capacitor to the third current source and connects the second capacitor to the second current source.

The controller connects the first capacitor to the first current source and connects the second capacitor to the fourth current source if the comparison result of the comparing unit is a first value and connects the first capacitor to the third current source and connects the second capacitor to the second current source if the comparison result of the comparing unit is a second value.

The signal storage unit may include: a sampling capacitor; an operational amplifier; a holding capacitor that is connected between the output terminal and the first input terminal of the operation amplifier; a reset switch that resets the holding capacitor; and a switch circuit that transfers charge voltage to the holding capacitor after the sampling capacitor charges the input signal at the time of sampling the input signal and additionally transfers the charge voltage to the holding capacitor after the sampling capacitor charges the reference current at the time of sampling the reference current.

The signal storage unit may be configured so that the sampling capacitor and the holding capacitor have the same capacitance.

The signal storage unit may include: first and second capacitors; and a first switch circuit that applies the input signal to the first capacitor at the time of sampling the input signal and connects the reference current supplying unit to the second capacitor at the time of sampling the reference current.

The reference current supplying unit may include: a first current source that supplies the reference current to the second capacitor; a second current source that discharges the reference current from the second capacitor; and a second switch circuit that connects the second capacitor to the first current source or the second current source.

The controller may connect the second capacitor to the first current source if the comparison result of the comparing unit is a first value and connect the second capacitor to the second current source if the comparison result of the comparing unit is a second value.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Although the present invention can be modified variously and have several embodiments, the exemplary embodiments are illustrated in the accompanying drawings and will be described in detail in the detailed description.

However, the present invention is not limited to the specific embodiments and should be construed as including all the changes, equivalents, and substitutions included in the spirit and scope of the present invention.

Further, terms used in the specification, 'first', 'second', etc. can be used to describe various components, but the components are not to be construed as being limited to the terms used herein. The terms are only used to differentiate one component from other components. For example, the first component may be called the second component without departing from the scope of the present invention. Likewise, the second component may be called the first component. The term 'and/or' includes a combination of a plurality of items or any one of a plurality of terms.

If it is stated that any components are "connected" or "coupled" to other components, it is to be understood that the components may be directly connected or coupled to other components, but there is another component therebetween. On the other hand, if it is stated that any components are "directly connected" or "directly coupled" to other components, it is to be understood that there is no another component therebetween.

The terms used in the specification are used to describe only specific embodiments and are not intended to limit the present invention. Singular forms used herein are intended to include plural forms unless the context clearly indicates otherwise. It will be further understood that the terms "comprises" or "have," as used in this specification, specify the presence of stated features, steps, operations, components, parts, or a combination thereof, but do not preclude the presence or addition of one or more other features, numerals, steps, operations, components, parts, or a combination thereof.

Unless indicated otherwise, it is to be understood that all the terms used in the specification including technical and scientific terms have the same meaning as those that are understood by those who skilled in the art. It must be understood that terms as defined by the dictionary are identical with the meaning of the context of the related art, and they should not be ideally or excessively formally defined unless the context clearly dictate otherwise.

Hereinafter, exemplary embodiments of the present invention will be described in detail with reference to the accompanying drawings. In describing the present invention, like components are denoted by like reference numerals in order to help in an overall understanding of the present invention and the description of the same components will not be repeated.

Figure 2:
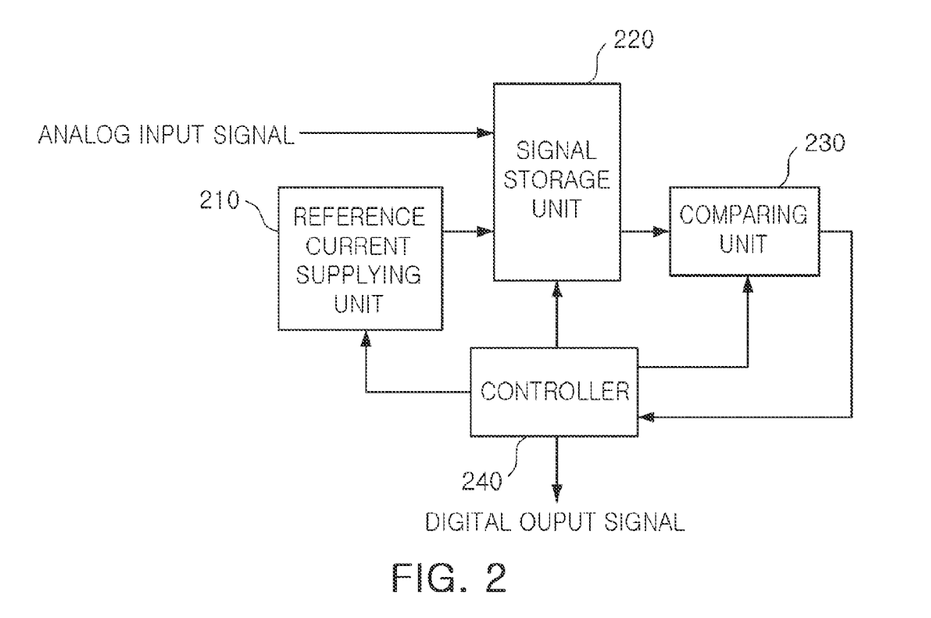
FIG. 2 is a diagram showing a configuration of an SAR ADC according to a first exemplary embodiment of the present invention.

FIG. 2 is a diagram showing a configuration of an SAR ADC according to a first exemplary embodiment of the present invention.

As shown in FIG. 2, an SAR ADC according to the present invention is configured to include a reference current supplying unit 210 that supplies a reference current (or a reference charge), a signal storage unit 220 that stores a reference signal generated by charging the reference current supplied from the reference current supplying unit 210 and analog input signals input from the outside, a comparing unit 230 that compares the reference signal and the input signal stored in the signal storage unit 220, and a controller 240 that controls the reference current supplying unit 210 based on the comparison results of the comparing unit 230 to change the supply amount of the reference current supplied to the signal storage unit 220 in proportion to a binary code.

Figure 3A:
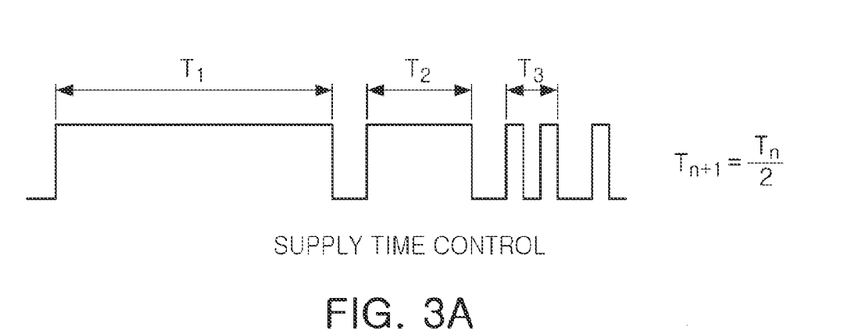
FIGS. 3A and 3B are diagrams for explaining a method for controlling reference current supply amount according to exemplary embodiments of the present invention.
Figure 3B:
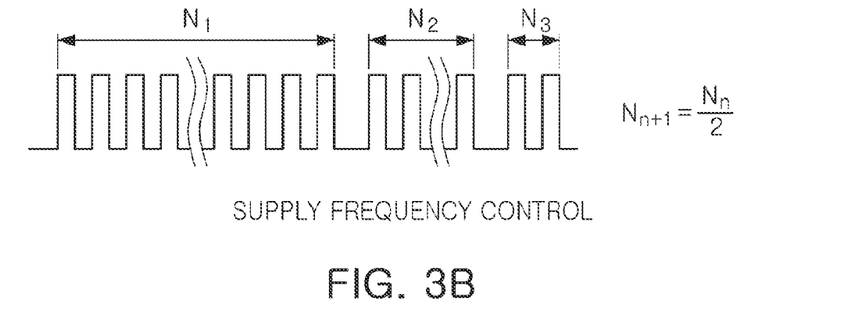

In this case, the controller 240 performs a control to change the supply time of the reference current in proportion to a binary code (that is, $T_{n+1}=T_n/2$) as shown in FIG. 3A and performs a control to change the supply frequency of the reference current in proportion to the binary code (that is, $N_{n+1}=N_n/2$) as shown in FIG. 3B, thereby controlling the amount of the reference current supplied to the signal storage unit 220 from the reference current supplying unit 210.

In addition, the signal storage unit 220 may include a single capacitor to store only the difference in a signal value between the input signal and the reference signal and may include two capacitors to individually store the input signal and the reference signal.

The operation of the SAR ADC of FIG. 2 will now be described. For convenience of explanation, it is assumed that the controller 240 controls the supply time of the reference current to control the supply amount of the reference current.

First, in order to convert analog signals input from the outside into digital signals, the signal storage unit 220 samples and fixes the input signals provided from the outside.

Thereafter, the reference current supplying unit 210 supplies the reference current to the signal storage unit 220 for time T1 under the control of the controller 240 and the signal storage unit 220 collects the reference current supplied for time T1 to generate the reference signal and compares the reference signal with the input signal.

As the comparison result of the comparing unit 230, if it is determined that the signal value of the reference signal is smaller than the signal value of the input signal, the controller 240 sets a most-significant bit (MSB) bN−1 (N is the number of bits of targeted resolution) to 1 and changes the signal value of the reference signal stored in the signal storage unit 220 by supplying the reference current by the reference current supplying unit 210 for next time T2 (=T1/2).

On the other hand, if it is determined that the reference voltage is greater than the voltage of the input signal, the controller 240 sets the MSB bN−1 to 0 and changes the signal value of the reference signal stored in the signal storage unit 220 by discharging the reference current by the reference current supplying unit 210 for time T2.

Since the reference current supplying unit 210 uses a current source into which constant current flows, the amount of the reference current that is supplied or discharged to and from the signal storage unit 220 is accurately proportional to the supply time of the reference current (or, the connection time of the reference current supplying unit 210 and the signal storage unit 220).

Therefore, as shown in FIG. 3A, when the supply time of the reference current is reduced in the sequence of T1, T1/2, T1/4, . . . , T1/2N−1, the signal value of the reference signal stored in the signal storage unit 220 is also changed in proportion to the sequence of T1, T1/2, T1/4, T1/2N−1.

The present invention performs the binary search by using this principle, such that it can sequentially know the digital value corresponding to the signal value of the input signal from the MSB bN−1 to LSB b0.

FIGS. 3A and 3B are diagrams for explaining a method for controlling the amount of a supplied reference current according to exemplary embodiments of the present invention.

First, referring to FIG. 3A, it can be appreciated that the supply amount of the reference current may be changed in proportion to the binary code by reducing the supply time of the reference current by half. In other words, it can be appreciated that the supply amount of the reference current is changed in proportion to the binary code by reducing the supply time of the reference current in the sequence of T1, T1/2, T1/4, T1/2N−1.

Further, referring to FIG. 3B, it can be appreciated that the supply amount of the reference current may be changed in proportion to the binary code by reducing the supply frequency of the reference current by half. In other words, it can be appreciated that the supply amount of the reference current is changed in proportion to the binary code by reducing the supply frequency of the reference current in the sequence of N1, N1/2, N1/4, . . . , N1/2N−1.

Further, in the present invention, the current value used to supply the above-mentioned reference current by the reference current supplying unit 210 is very important. It is preferable that the current value is set to a current value so that the signal value (that is, the signal value of the reference signal generated by first receiving the reference current) of the reference signal stored in the signal storage unit 220 is half of the full-scale input Vfs of the analog-to-digital converter by supplying the reference current for an MSB period, that is, time T1.

Figure 4:
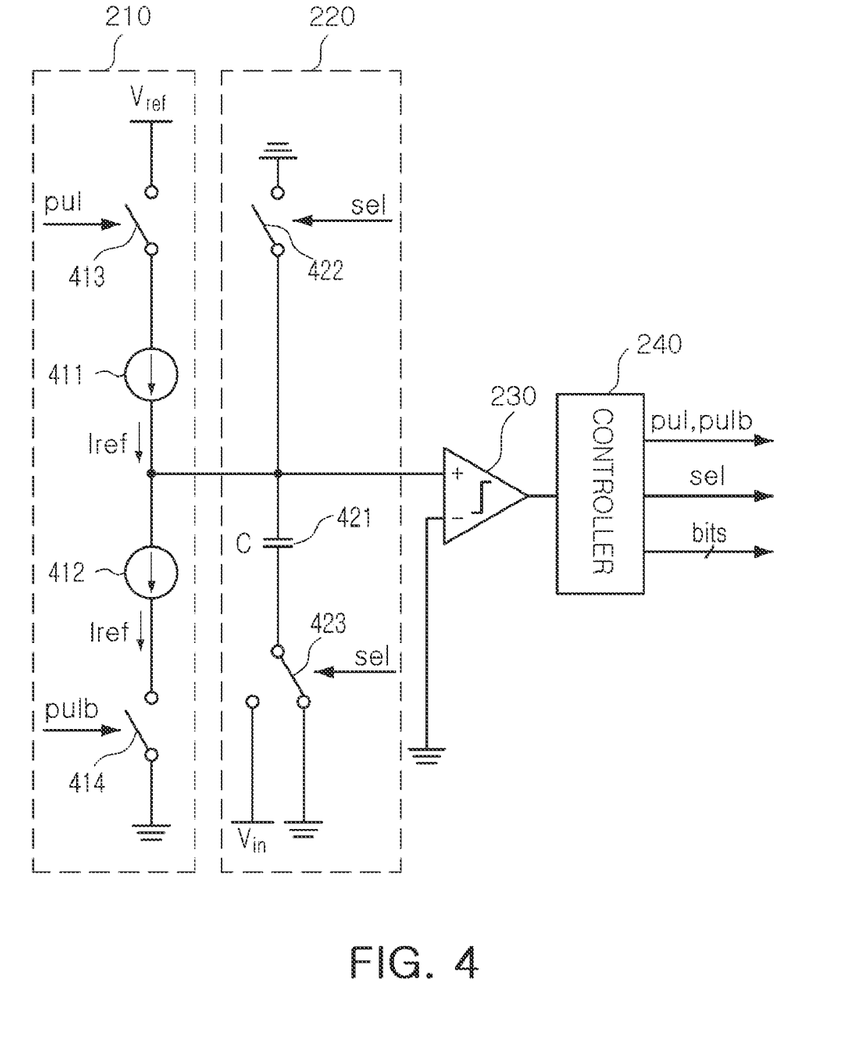
FIG. 4 is a diagram showing a detailed configuration of the SAR ADC according to the first exemplary embodiment of the present invention.

FIG. 4 is a diagram showing a detailed configuration of the SAR ADC according to the first exemplary embodiment of the present invention. In this case, the signal storage unit 220 is implemented as a type that includes one capacitor storing the difference between the input signal and the reference signal.

Referring to FIG. 4, the signal storage unit 220 is configured to include a capacitor 421 and first switch circuits 422 and 423 that applies an input signal Vin to the capacitor 421 at the time of sampling the input signal and connects the reference current supplying unit 210 to the capacitor 421 at the time of sampling the reference signal. The comparing unit 230 is implemented as a comparator that compares the voltage charged in the capacitor 421 with the ground voltage.

The reference current supplying unit 210 is configured to include a first current source 411 that supplies a reference current Iref to the capacitor 421 included in the signal storage unit 220, a second current source 412 that discharges the reference current Iref from the capacitor 421, and second switch circuits 413 and 414 that connect the first current source 411 to the capacitor 421 if pulse signals pul and pulb have a first value (that is, the pulse signal is a high level and the pulse inversion signal pulb is a low level) and connect the second current source 412 to the capacitor 421 if the pulse signals pul and pulb has a second value (that is, the pulse signal pul is a low level and the pulse inversion signal pulb is a high level).

The controller 240 is implemented as a logic circuit that generates the pulse signals pul and pulb to vary the supply amount of the reference current while generating the digital output signals (bits) based on the comparison result of the comparing unit 230. Further, the controller 240 may generate various additional signals (for example, an operational selection signal sel instructing the input signal sampling operation and the reference signal sampling operation) that can determine and control the operational state of the analog-to-digital converter.

The operation of the SAR ADC of FIG. 4 will now be described.

In the input signal sampling interval, the switch 422 connected to one terminal of the capacitor 421 is connected to the ground and the switch 423 connected to the other terminal of the capacitor 421 is connected to the input signal Vin, such that the input signal Vin is stored in the capacitor 421.

Then, in the reference signal sampling interval, the switch 422 is in the open state and the switch 423 is connected to the ground.

In this state, if the switch 413 connected to the first current source 411 is turned-on by the pulse signal pul for time T1, the first current source 411 supplies the reference current Iref to the capacitor 421 for time T1. In this case, the capacitor 421 generates the charge voltage having the value of "−Vin+Iref*T1/C" (Vin is the input signal that is stored in the capacitor 421, Iref is the reference current, T1 is the supply time of the reference current, and C is the capacitance of the capacitor 421). In this case, Iref*T1/C has a value corresponding to half of the maximum input value Vfs of the analog-to-digital converter as described above.

Thereafter, the comparing unit 230 determines whether the charge voltage of the capacitor 421 is a positive value or a negative value. The controller 240 determines that the input signal is greater than the reference signal if it is determined that the charge voltage of the capacitor 421 is a positive value, sets the MSB bN−1 value to 1, and then, turns-on the switch 413 connected to the first current source 411 for time T2 (=T1/2), so that the reference current of the first current source 411 is supplied only for time T2. On the other hand, if the charge voltage is a negative value, the controller 240 determines that the input signal is smaller than the reference signal, sets the MSB bN−1 value to 0, and then, turns-on the switch 414 connected to the second current source 412 for time T2 (=T1/2), so that the reference current is discharged from the capacitor 421 for time T2. In this case, the voltage of the capacitor 421 becomes "−Vin+(½−¼*(−1)(bN−1))Vfs". Thereafter, the comparing unit 230 again compares the charge voltage of the capacitor 421 with the ground voltage to determine whether the charge voltage is a positive value or a negative value. The controller 240 sets the MSB bn−2 value to 1 if it is determined that the input signal is greater than the reference signal and further supplies the reference current to the capacitor 421 only for time T3 (=T1/4) and sets the MSB bn−2 value to 0 if it is determined that the input signal is smaller than the reference signal and discharges the reference current from the capacitor 421 for time T3.

As described above, the SAR ADC of FIG. 4 changes the value of the reference signal stored in the capacitor 421 in proportion to the binary code while repeatedly performing the above-mentioned operation.

Therefore, the SAR ADC of FIG. 4 uses the value of the reference signal changed in proportion to the binary code to compare the input signals in the binary search manner, thereby making it possible to determine the value of the digital output signal from the MSB bN−1 to the LSB b0.

Figure 5:
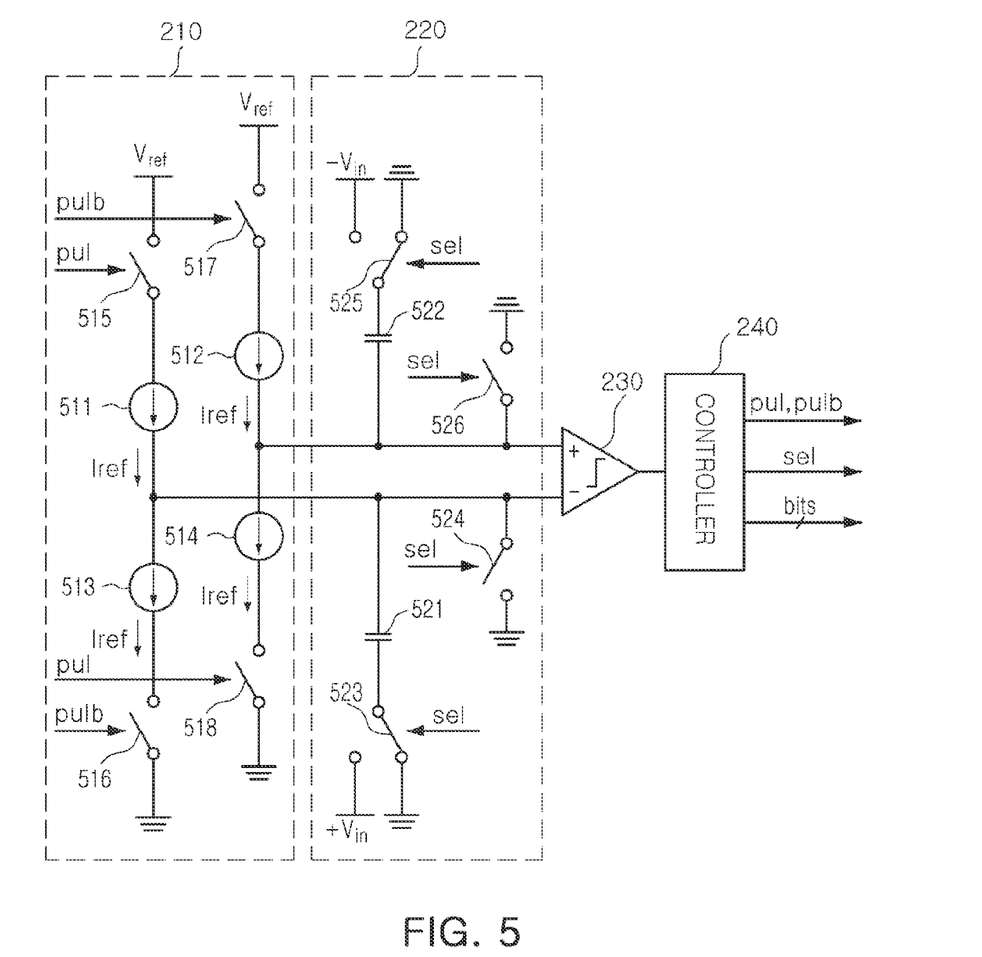
FIG. 5 is a diagram showing an SAR ADC according to a second exemplary embodiment of the present invention.

The SAR ADC of FIG. 4 may be converted into the differential structure as shown in FIG. 5 to have the very strong characteristics against the common noise.

FIG. 5 is a diagram showing an SAR ADC according to a second exemplary embodiment of the present invention.

Referring to FIG. 5, the signal storage unit 220 of the SAR ADC according to the second exemplary embodiment of the present invention is configured to include first and second capacitors 521 and 522 and first switch circuits 523 to 526 that applies an input signal pair +Vin and −Vin to the first and second capacitors 521 and 522 at the time of sampling the input signal and connects the reference current supplying unit 210 to the first and second capacitors 521 and 522 at the time of sampling the reference signal. The comparing unit 230 is implemented as a comparator that compares the voltage charged in the first capacitor 521 with the voltage charged in the second capacitor 522.

The reference current supply unit 210 is configured to include first and second current sources 511 and 512 that supply the reference current to each of the first and second capacitors 521 and 522 included in the signal storage unit 220, third and fourth current sources 513 and 514 that discharge the reference current from the first and second capacitors 521 and 522, respectively, and second switch circuits 515 to 518 that connect the first capacitor 521 to the first current source 511 and connects the second capacitor 522 to the fourth current source 514 if the pulse signals pul and pulb have the first value, connects the first capacitor 521 to the third current source 513 and connects the second capacitor 522 to the second current source 514 if the pulse signals pul and pulb have the second value.

The controller 240 is implemented as a programmed logic circuit that generates the pulse signals pul and pulb to vary the amount of the reference current supplied while generating the digital output signals (bits) based on the comparison result of the comparing unit 230. Further, the controller 240 may generate various additional signals (for example, an operational selection signal sel instructing the first and second capacitors 521 and 522 to alternately store the difference between the input signal and the reference signal) that can determine and control the operational state of the analog-to-digital converter.

In this case, the SAR ADC of FIG. 5 uses two capacitors 521 and 522 to store the difference between the input signal and the reference signal in the differential manner and generate the corresponding digital output signal; however, it can be appreciated that the signal values of the reference signals stored in each of the two capacitors 521 and 522 are changed in proportion to the binary code in the same manner as FIG. 4.

Therefore, the SAR ADC of FIG. 5 compares the reference signal having the signal value changed in proportion to the binary code with the input signal in the binary search manner as in the SAR ADC of FIG. 4, such that the value of the digital output signal can be determined from the MSB bN−1 to the LSB b0.

Figure 6:
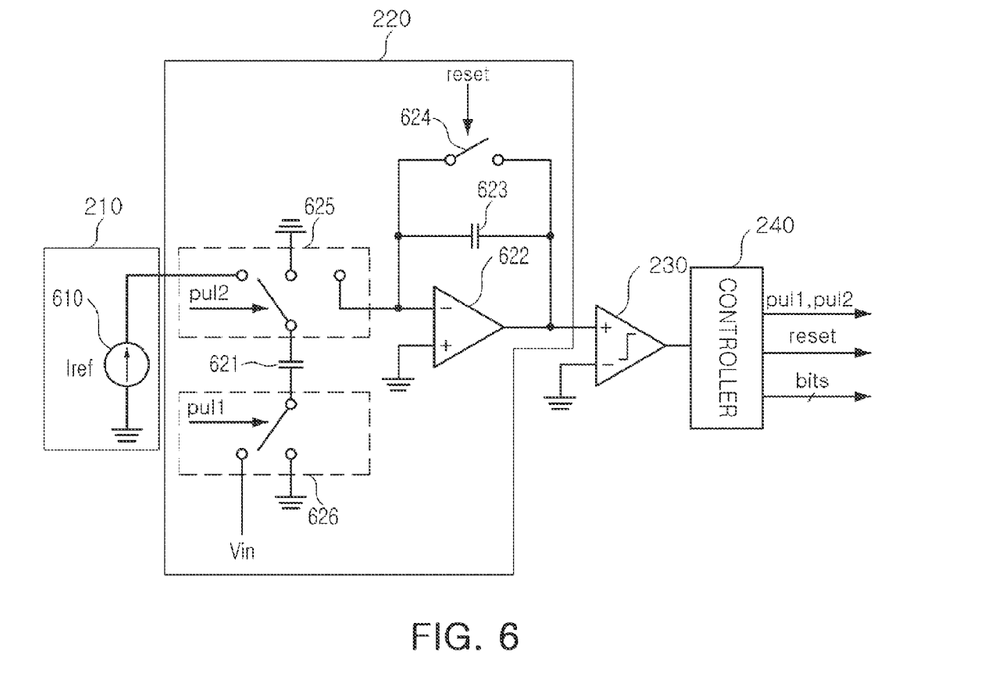
FIG. 6 is a diagram showing an SAR ADC according to a third exemplary embodiment of the present invention.

In the present invention, the reference current supplying unit may be implemented to include only one current source as shown in FIG. 6. In this case, the current values provided by two current sources are different, such that the generable operational errors are previously removed.

FIG. 6 is a diagram showing an SAR ADC according to a third exemplary embodiment of the present invention. In this case, the reference current supplying unit is implemented as a type including only one current source.

Referring to FIG. 6, the reference current supplying unit 210 includes only one current source 610. The signal storage unit 220 is configured to include a sampling capacitor 621, an operational amplifier 622, a holding capacitor 623 that is connected between an output terminal and a first input terminal of the operational amplifier, a reset switch 624 that is connected to the holding capacitor 623 in parallel to reset the holding capacitor 623, and switch circuits 625 and 626 that allows the sampling capacitor 621 to charge the input signal Vin and then, transmits the charge voltage to the holding capacitor 623 at the time of sampling the input signal and allows the sampling capacitor 621 to charge the reference current and then further transmit the charge voltage to the holding capacitor 623 at the time of sampling the reference current.

In this configuration, it is preferable that the sampling capacitor 621 and the holding capacitor 623 have the same capacitance. Further, when the sampling capacitor 621 is connected to the reference current supplying unit 210, they are connected to each other in the same polarity and when the sampling capacitor 621 is connected to the holding capacitor 623, they are connected to each other by changing the polarity according to the values of the previous bits. However, the sampling capacitor 621 may be always connected to the holding capacitor 623 in the same direction and the sampling capacitor 621 may be connected to the reference current supplying unit 210 by changing the polarity according to the values of previous bits.

The controller 240 is implemented as a programmed logic circuit that generates the digital output signals (bits) having a value corresponding to the comparison result of the comparing unit 230 and pulse signals pul1 and pul2 for simultaneously controlling the operational state of the SAR ADC and the supply amount of the reference current. Further, the controller 240 may also generate various additional signals (for example, a reset signal for resetting the holding capacitor) that can determine and control the operational state of the analog-to-digital converter.

The operation of the SAR ADC of FIG. 6 will now be described.

In the input signal sampling interval, the switch 625 connected to one terminal of the sampling capacitor 621 is connected to the ground and the switch 626 connected to the other terminal of the sampling capacitor 621 is connected to the input signal Vin, such that the sampling capacitor 621 is supplied and stored with the input signal Vin. The holding capacitor 623 is reset by the reset switch 624.

When the input signal sampling completes, the switch 625 is a negative terminal of the operational amplifier 622 and the switch 626 is connected to the ground. Thereafter, since the input terminal of the operational amplifier 622 is in a virtual ground state, all the voltage charged in the sampling capacitor 621 moves to the holding capacitor 623 if the electric capacity of the sampling capacitor 621 is equal to that of the holding capacitor 623.

In the reference sampling interval after all the charges are transferred, the switch 625 is connected to the current source 610 and the switch 626 is connected to the ground and the sampling capacitor 621 charges the reference current supplied from the current source 610.

In this case, the connection time of the sampling capacitor 621 and the current source 610 is also controlled in proportion to the above-mentioned binary code. That is, the connection time of the sampling capacitor 621 and the current source 610 is reduced to the sequence of T1, T1/2, T1/4, . . . , T1/2N−1.

When time T1 elapses, the switch 625 is back connected to a negative terminal of the operational amplifier 622 and thus, all the voltage charged in the sampling capacitor 621 moves once to the holding capacitor 623.

As a result, the holding capacitor 623 generates the voltage having the value "Vin−Iref*T1/C" (where Vin is the input signal, C is the capacitance of the holding capacitor 623, and the Iref is the reference current). In this case, Iref*T1/C has a value corresponding to half of the maximum input value Vfs of the analog-to-digital converter.

The comparing unit 230 determines whether the charge voltage of the holding capacitor 623 is a positive value (that is, the input signal is greater than the reference signal) or a negative value (that is, the input signal is smaller than the reference signal). If the charge voltage of the holding capacitor 623 is a positive value, the value of the MSB bN−1 becomes 1 and if the charge voltage of the holding capacitor 623 is a negative value, the value of the MSB bN−1 becomes 0.

The controller 240 back connects the switch 625 to the current source 610 for time T2 (=T1/2). When the value of bN−1 is 1, each of the switches 625 and 626 are connected to the negative terminal of the operational amplifier 622 and the ground and when the value of the bN−1 is 0, each of the switch 625 and the switch 626 is connected to the negative terminal of the operational amplifier 622.

The charge voltage of the holding capacitor 623 becomes Vin−(½−¼*(−1)(bN−1)) VFS according to the bN−1 value and the next bit bN−2 value of the MSB is defined according to the sign of the value. All the final digital output values can be obtained by sequentially performing the above-mentioned processes from the MSB bN−1 to the LSB b0.

As described above, the SAR ADC of the FIG. 6 changes the reference current supplied to the sampling capacitor 621 in proportion to the binary code while repeatedly performing the above-mentioned operation.

Therefore, the SAR ADC of FIG. 6 also compares the input signals by using the reference current changed in proportion to the binary code in the binary search manner, thereby making it possible to alter the value of the digital output signal from the MSB bN−1 to the LSB b0.

Figure 7:
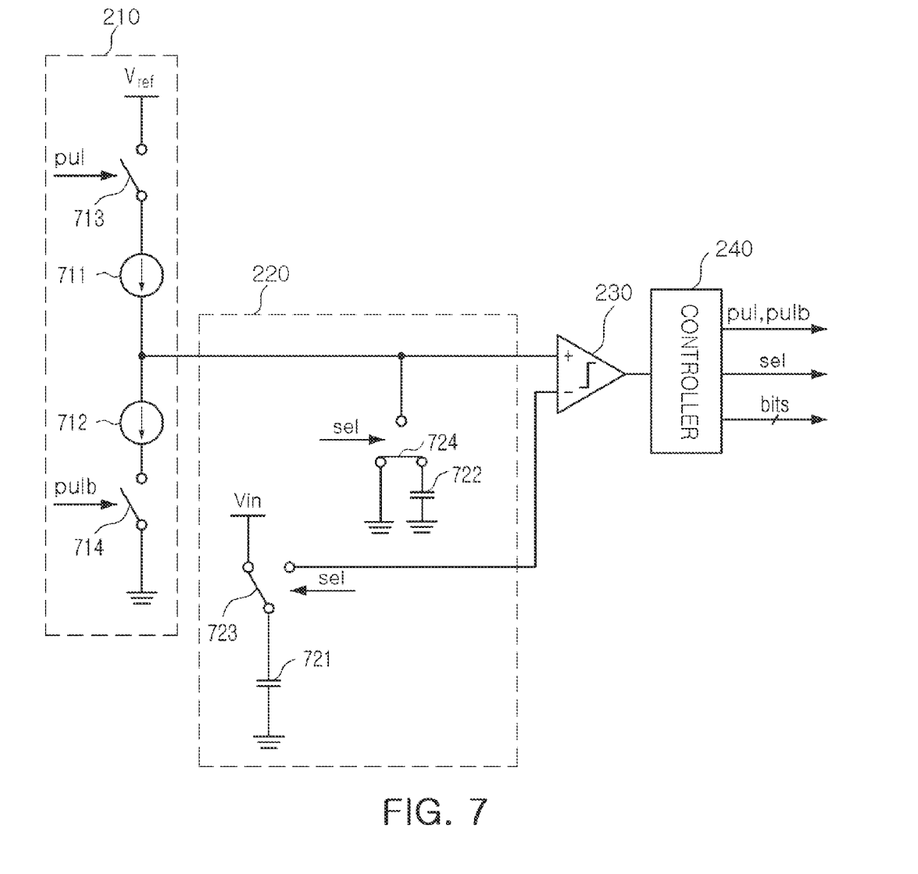
FIG. 7 is a diagram showing an SAR ADC according to a fourth exemplary embodiment of the present invention.

FIG. 7 is a diagram showing the SAR ADC according to the fourth exemplary embodiment. In this case, the signal storage unit 220 is implemented as a type including two capacitors 721 and 722 individually storing the input signal and the reference signal.

Referring to FIG. 7, the signal storage unit 220 is configured to include first and second capacitors 721 and 722 and first switch circuits 723 and 724 that apply the input signal Vin to the first capacitor 721 at the time of sampling the input signal and allow the comparing unit 230 to compare the charges charged in the first and second capacitors 721 and 722 while applying the current of the reference current supplying unit 210 to the second capacitor 722 at the time of sampling the reference signals.

The reference current supplying unit 210 is configured to include the first current source 711 that supplies a reference current to the second capacitor 722, the second current source 712 that discharges the reference current from the second capacitor 722, and the second switch circuits 713 and 714 that connect the first current source 711 to the second capacitor 722 if the pulse signals pul and pulb have the first value (that is, the pulse signal is a high level and the pulse inversion signal pulb is a low level) and connect the second current source 712 to the second capacitor 722 it the pulse signals pul and pulb has the second value (that is, the pulse signal pul is a low level and the pulse inversion signal pulb is a high level).

The controller 240 is implemented as a programmed logic circuit that generates the pulse signals pul and pulb to vary the amount of supplied reference current while generating the digital output signals (bits) based on the comparison result of the comparing unit 230. Further, the controller 240 may generate various additional signals, for example, an operational selection signal sel instructing the input signal sampling operation and the reference signal sampling operation that can determine and control the operational state of the analog-to-digital converter.

The operation of the SAR ADC of FIG. 7 will now be described.

First, in the input signal sampling interval, the first capacitor 721 is connected to the input signal Vin through the switch 723 so that the input signal Vin is stored in the first capacitor 721. In this case, the switch 724 resets the second capacitor 722 by connecting the second capacitor 722 to the ground.

In the reference signal sampling interval, the first capacitor 721 is connected to the negative terminal of the comparing unit 230 through the first switch 723 and the second capacitor 722 is connected to a contact between the output terminal of the reference current supply unit 210 through the switch 724 and the positive terminal of the comparing unit 230. In this state, when the switch 713 connected to the first current source 711 is turned-on for time T1, the first current source 711 and the second capacitor 722 are connected to each other so that the second capacitor 722 receives the reference current Iref of the first current source 711 for time T1 and stores the reference signal.

The comparing unit 230 compares the input signal and the reference signal stored in the first capacitor 721 and the second capacitor 722 and the controller 240 sets the MSB bN−1 value to 1 if the input signal is greater than the reference signal and then, turns-on the switch 713 connected to the first current source 711 for time T2 (=T1/2) so that the reference current of the first current source 711 is supplied only for time T2. On the other hand, if the input signal is smaller than the reference signal, the controller 240 sets the MSB bN−1 value to 0, and then, turns-on the switch 714 connected to the second current source 712 for time T2 (=T1/2), so that the reference current discharges from the second capacitor 722 for time T2.

Then, the comparing unit 230 back compares the input signal and the reference signal stored in the first capacitor 721 and the second capacitor 722 and if the input signal is greater than the reference signal, the controller 240 sets the MSB bN−2 value to 1 and further supplies the reference current to the second capacitor 722 only for T3 (=T1/4) and if the input signal is smaller than the reference signal, discharges the reference current from the second capacitor 722 for time T3.

As described above, the SAR ADC of the FIG. 7 changes the value of the reference signal stored in the second capacitor 722 in proportion to the binary code while repeatedly performing the above-mentioned operation.

Therefore, the SAR ADC of FIG. 7 also compares the input signals by using the reference signal changed in proportion to the binary code in the binary search manner, thereby making it possible to the value of the digital output signal from the MSB bN−1 to the LSB b0.

As set forth above, according to exemplary embodiments of the invention, the successive approximation analog-to-digital converter can control the signal value of the reference signal in a software manner and can compare the input signals by using the signal value in the binary search manner, thereby making it possible to include only the minimum capacitor. Therefore, the successive approximation analog-to-digital converter according to the present invention can have the reduced capacitance and circuit area and remove the matching problem of the capacitor generated by including the plurality of capacitors, thereby having the very strong process change resistance characteristics.

Even though the mismatch problem between the capacitors included in the successive approximation analog-to-digital converter occurs, the present invention controls the supply amount of the reference current provided to each capacitor, thereby making it possible to easily solve the mismatch problem.

In addition, when sampling the input signal and the reference signal, only charges corresponding to one capacitor are used, thereby making it possible to dramatically reduce power consumption.

While the present invention has been shown and described in connection with the exemplary embodiments, it will be apparent to those skilled in the art that modifications and variations can be made without departing from the spirit and scope of the invention as defined by the appended claims.

What is claimed is:

1. A successive approximation analog-to-digital converter, comprising:
   a reference current supplying unit configured to supply a reference current;
   a signal storage unit configured to store a reference signal generated by charging the reference current and an input signal;
   a comparing unit configured to compare the reference signal and the input signal; and
   a controller configured to generate a control signal and a digital output signal based on the comparison result of the comparing unit,
   wherein the reference current supplying unit is configured to change, in response to the control signal, an amount of the reference current supplied to the signal storage unit in proportion to a binary code, and
   wherein the amount of the reference current supplied to the signal storage unit is reduced in a sequence of $T_1$, $T_1/2$, $T_1/4$, $T_1/2^{N-1}$ in proportion to the binary code, $T_1$ being a first supply amount of the reference current and N being a number of bits of targeted resolution.

2. The successive approximation analog-to-digital converter of claim 1, wherein the controller is configured to control the reference current supplying unit to change a supply time or a supply frequency of the reference current in proportion to the binary code.

3. The successive approximation analog-to-digital converter of claim 2, wherein the signal storage unit includes:
   a capacitor; and
   a first switch circuit configured to apply the input signal to the capacitor when the input signal is sampled and couple the reference current supplying unit to the capacitor when the reference current is sampled.

4. The successive approximation analog-to-digital converter of claim 3, wherein the reference current supplying unit includes:
   a first current source configured to supply the reference current to the capacitor;
   a second current source configured to discharge the reference current from the capacitor; and
   a second switch circuit configured to couple the capacitor to the first current source or the second current source in response to the control signal.

5. The successive approximation analog-to-digital converter of claim 4, wherein the controller is configured to control the reference current supplying unit so that the capacitor his coupled to the first current source if the comparison result of the comparing unit has a first value and so that the capacitor is coupled to the second current source if the comparison result of the comparing unit has a second value.

6. The successive approximation analog-to-digital converter of claim 3, wherein the signal storage unit includes:
   a sampling capacitor;
   an operational amplifier;
   a holding capacitor coupled between an output terminal and a first input terminal of the operation amplifier;
   a reset switch configured to reset the holding capacitor; and
   a switch circuit configured to transfer a charge voltage to the holding capacitor after the sampling capacitor is charged with the input signal when the input signal is sampled and transfer the charge voltage to the holding capacitor after the sampling capacitor is charged with the reference current when the reference current is sampled, in response to the control signal.

7. The successive approximation analog-to-digital converter of claim 6, wherein the sampling capacitor and the holding capacitor have substantially the same capacitance.

8. The successive approximation analog-to-digital converter of claim 2, wherein the signal storage unit includes:
   first and second capacitors; and
   a first switch circuit configured to apply an input signal pair to the first and second capacitors when the input signal is sampled and couple the reference current supplying unit to the first and second capacitors when the reference current is sampled,
   wherein the comparing unit is configured to compare a voltage charged in the first capacitor and a voltage charged in the second capacitor.

9. The successive approximation analog-to-digital converter of claim 8, wherein the reference current supply unit includes:
   first and second current sources configured to supply the reference current to each of the first and second capacitors;

third and fourth current sources configured to discharge the reference current from each of the first and second capacitors;

a second switch circuit configured to couple the first capacitor to the first current source and couple the second capacitor to the fourth current source or configured to couple the first capacitor to the third current source and couple the second capacitor to the second current source, in response to the control signal.

10. The successive approximation analog-to-digital converter of claim 9, wherein the controller is configured to control the reference current supplying unit so that the first and second capacitors are coupled to the first and fourth current source, respectively, if the comparison result of the comparing unit has a first value and so that the first and second capacitors are coupled to the third and second current sources, respectively, if the comparison result of the comparing unit has a second value.

11. The successive approximation analog-to-digital converter of claim 2, wherein the signal storage unit includes:
first and second capacitors; and
a first switch circuit configured to apply the input signal to the first capacitor when the input signal is sampled and couple the reference current supplying unit to the second capacitor when the reference current is sampled.

12. The successive approximation analog-to-digital converter of claim 11, wherein the reference current supplying unit includes:
a first current source configured to supply the reference current to the second capacitor;
a second current source configured to discharge the reference current from the second capacitor; and
a second switch circuit configured to couple the second capacitor to the first current source or the second current source in response to the control signal.

13. The successive approximation analog-to-digital converter of claim 12, wherein the controller is configured to control the reference current supplying unit so that the second capacitor is coupled to the first current source if the comparison result of the comparing unit has a first value and so that the second capacitor is coupled to the second current source if the comparison result of the comparing unit has a second value.

14. The successive approximation analog-to-digital converter of claim 1, wherein a signal value of the reference signal generated by first receiving the reference current is half of a maximum input value of the successive approximation analog-to-digital converter.

* * * * *